United States Patent
Stupak et al.

(10) Patent No.: US 10,741,051 B2
(45) Date of Patent: Aug. 11, 2020

(54) METHOD FOR LOOSE JOINT DETECTION IN MEDIUM VOLTAGE SWITCHGEARS AND MEDIUM VOLTAGE SWITCHGEAR ITSELF

(71) Applicant: ABB Schweiz AG, Baden (CH)

(72) Inventors: Marcel Stupak, Brno (CZ); Tomas Kozel, Brno (CZ); Massimo Scarpellini, Dalmine (IT); Stefano Magoni, Osio Sotto (IT)

(73) Assignee: ABB SCHWEIZ AG, Baden (CH)

( * ) Notice: Subject to any disclaimer, the term of this patent is extended or adjusted under 35 U.S.C. 154(b) by 343 days.

(21) Appl. No.: 15/353,750

(22) Filed: Nov. 17, 2016

(65) Prior Publication Data
US 2017/0146471 A1  May 25, 2017

(30) Foreign Application Priority Data
Nov. 19, 2015 (EP) .................... 15195462

(51) Int. Cl.
*G01N 25/72* (2006.01)
*G08B 21/18* (2006.01)
(Continued)

(52) U.S. Cl.
CPC .......... *G08B 21/182* (2013.01); *G01K 13/00* (2013.01); *G01N 25/72* (2013.01);
(Continued)

(58) Field of Classification Search
CPC combination set(s) only.
See application file for complete search history.

(56) References Cited

U.S. PATENT DOCUMENTS 5,107,447 A    4/1992 Ozawa et al.
7,561,412 B2   7/2009 Brandt et al.
(Continued)

FOREIGN PATENT DOCUMENTS

CA    2533376 C    12/2014
CN    2784897 Y    5/2006
(Continued)

OTHER PUBLICATIONS

EPO Translation of CN2748497. (Year: 2006).*

*Primary Examiner* — Lisa M Caputo
*Assistant Examiner* — Nasir U. Ahmed
(74) *Attorney, Agent, or Firm* — Leydig, Voit & Mayer, Ltd.

(57) ABSTRACT

A method for loose joint detection in medium voltage switchgears with busbar joints, circuit breaker upper and lower spouts, and cable connection joints, arranged in an air insulated housing, and medium voltage switchgear itself, in order to create an effective loose joint detection with lower operating expense, but with high performance and accuracy, involves measuring actual temperatures at a first phase as a first temperature (T1), at a second phase as a second temperature (T2), at a third phase as a third temperature (T3), at predefined critical points, such as at the busbar joints, and/or at the circuit breaker upper spouts, and/or at the circuit breaker lower spouts, and/or the cable connection; and comparing temperatures in a logical dependency $T_i > (T_j + dT)$, with $i \neq j$, permuted with i from 1, 2, 3, and j from 1, 2, 3, and setting the alarm if the logical dependency is fulfilled.

18 Claims, 2 Drawing Sheets

(51) Int. Cl.
  *H02B 13/065* (2006.01)
  *G01K 13/00* (2006.01)
  *G01R 31/327* (2006.01)
  *H02B 1/04* (2006.01)
  *H02B 1/20* (2006.01)
  *H02B 1/24* (2006.01)
  *H02B 1/06* (2006.01)
  *H02B 13/025* (2006.01)
  *H02B 13/035* (2006.01)
  *H02B 11/12* (2006.01)

(52) U.S. Cl.
  CPC ..... *G01R 31/3274* (2013.01); *G01R 31/3275* (2013.01); *H02B 1/04* (2013.01); *H02B 1/06* (2013.01); *H02B 1/20* (2013.01); *H02B 1/24* (2013.01); *H02B 13/025* (2013.01); *H02B 13/035* (2013.01); *H02B 13/065* (2013.01); *H02B 11/12* (2013.01)

(56) References Cited

U.S. PATENT DOCUMENTS

| | | | | |
|---|---|---|---|---|
| 2012/0194344 | A1* | 8/2012 | McNamara | H02J 13/00 340/584 |
| 2014/0195172 | A1* | 7/2014 | Le | G06F 17/00 702/47 |
| 2015/0088461 | A1* | 3/2015 | Tanaka | G05B 23/027 702/183 |

FOREIGN PATENT DOCUMENTS

| | | |
|---|---|---|
| CN | 202749529 U | 2/2013 |
| CN | 104076242 A | 10/2014 |
| DE | 102014102509 A1 | 8/2015 |
| EP | 0342597 A2 | 11/1989 |
| EP | 2452415 B1 | 5/2012 |
| KR | 101458115 B1 | 11/2014 |
| WO | WO 0148498 A1 | 7/2001 |

* cited by examiner

METHOD FOR LOOSE JOINT DETECTION IN MEDIUM VOLTAGE SWITCHGEARS AND MEDIUM VOLTAGE SWITCHGEAR ITSELF

CROSS-REFERENCE TO RELATED APPLICATIONS

Priority is claimed to European Patent Application No. 15 195 462.5, filed on Nov. 19, 2015, the entire disclosure of which is hereby incorporated by reference herein.

FIELD

The invention relates to a method for loose joint detection in medium voltage switchgears with busbar joints, circuit breaker upper and lower spouts, and cable connection joints, arranged in an air insulated housing, and medium voltage switchgear itself.

BACKGROUND

Loose joints in aforesaid switchgears produce local heat as a consequence of higher transition resistances of such loose joints. Such faults have to be detected, because in dependency of the resulting higher electrical resistance, the produced heat can rise to destructive level, but in any case it produces energy loss in the electrical network. Current practice of loose joint detection involves complex temperatures and currents measurement collected in one point for the whole switchboard, consisting of certain numbers of switchgear panels. In know switchgears, a complex map of the temperatures and currents within the switchboard is created and hot spots are detected by correlating the currents and temperatures. This is expensive because of many measuring points and centralized processing.

A further disadvantage is, that with a centralized system, it is impossible to detect a loose joint in one panel without the measurement from other switchgear panels, and it results in a complex data collection and processing.

SUMMARY

An aspect of the invention provides a method for loose joint detection in a three phase medium voltage switchgear including busbar joints, circuit breaker upper and lower spouts, and cable connection joints, arranged in an air insulated housing, and several temperature measurement points, the method comprising: measuring actual temperatures are measured at a first phase as a first temperature (T1), at a second phase as a second temperature (T2), at a third phase as a third temperature (T3), at one or more predefined critical points; comparing the temperatures in a logical dependency: $Ti>(Tj+dT)$, with $i \neq j$, permuted with i from 1, 2, 3, and j from 1, 2, 3; and setting an alarm if the above condition is fulfilled.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

So it an aspect of the invention, to overcome the disadvantages discussed in the Background by creating an effective loose joint detection with lower operating expense, but with high performance and accuracy.

An aspect of the invention is, that the actual temperatures at the busbar joints (T1), at the circuit breaker upper and lower spouts (T2), and at the cable connection joints (T3) are measured with at least one temperature sensor per phase each, and that the concerning temperature are compared in the following logical dependency, $$Ti>(Tj+dT), \text{ with } I \neq j$$

permutated with i from 1, 2, 3
and j from 1, 2, 3
and alarm is set if the aforesaid condition is fulfilled.

By this, the loose contacts can be located very quick and easy.

In a further and advantageous embodiment, the method is embellished in such, that alarm is set, if loose joint in L1 is indicated if $T1>(T2+\Delta T)$ or $T1>(T3+\Delta T)$ and/or loose joint in L2 is indicated if $T2>(T1+\Delta T)$ or $T2>(T3+\Delta T)$, and/or loose joint in L3 is indicated if $T3>(T1+\Delta T)$ or $T3>(T2+\Delta T)$.

In a further advantageous embodiment, the value range for $\Delta T$ is predefined and stored in a control device, and that all temperatures are read into the control device, in which the evaluation after the rule of claim 1 or claim 2 is proceeded, and which an alarm signal is generated.

In order to have further diagnostic informations, a further embodiment is, that all measured temperature values are stored in a datafile, to enable also retroperspective analysis of historical data.

For that, the datafile is automatically steared and organized as a shift register with an adjustable time frame or time slot.

In order to adapt the system in a kind of self learning strategy, a further advantageous embodiment is, that the time slot is also event triggered, and/or that the retrospective time slot is also event triggered.

According to a medium voltage switchgear with loose joint detection means at busbar joints, circuit breaker upper and lower spouts, and cable connection joints, arranged in an air insulated housing, to proceed the method according to one of the method claims, the invention is, that temperature sensors are arranged at the following joint points of the switchgear, at the busbar joints, at the circuit breaker upper spouts, at the circuit breaker lower spouts, at the cable connection joints, and that such temperature sensors are arranged at all three phases of the aforesaid joints and spouts each, and that a central evaluation unit feed with all the aforesaid temperature sensors values is provided, in order to calculate the aforesaid conditions, mentioned in the claims 1 to 7.

Figure 1:
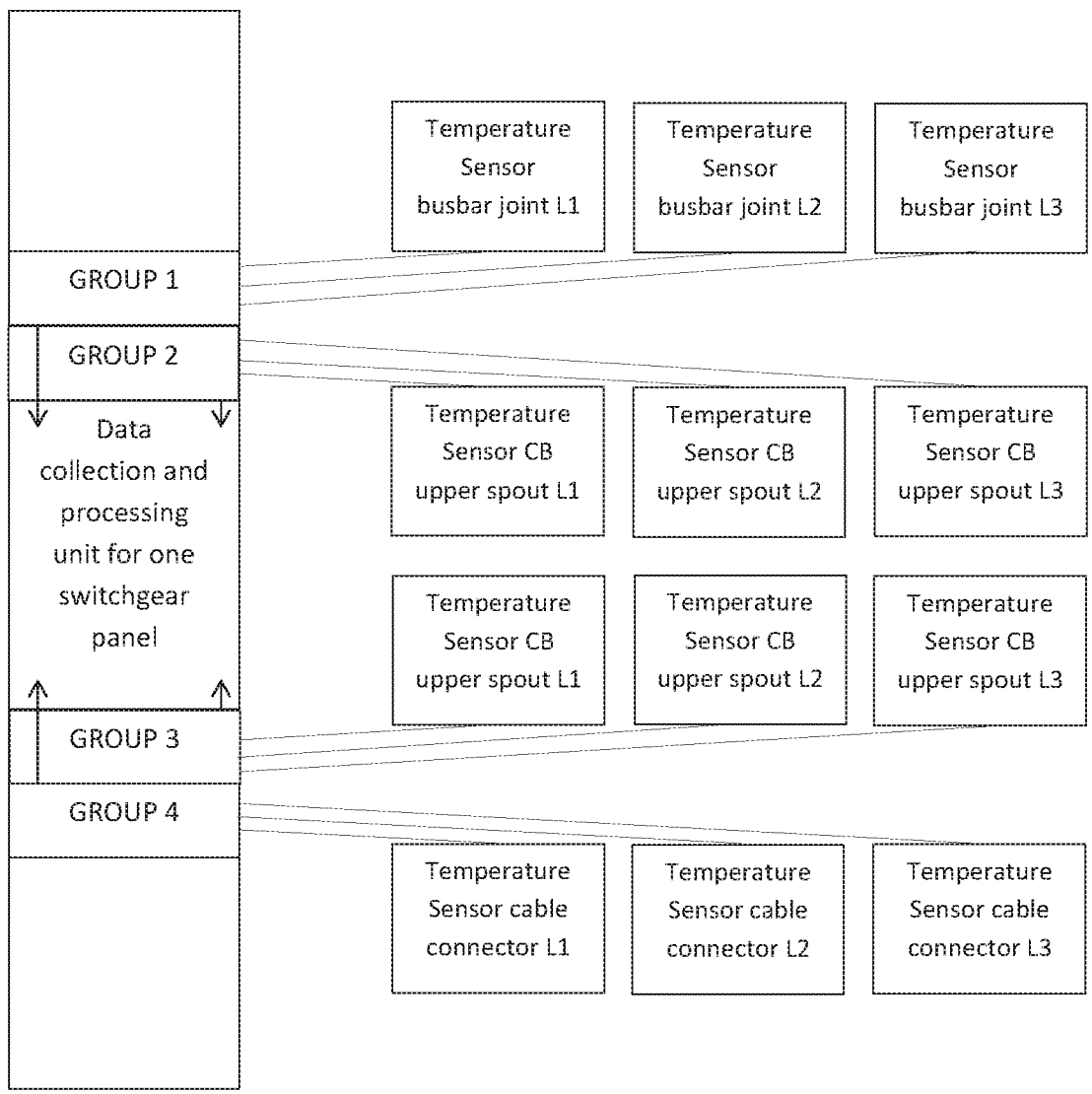
FIG. 1 a logical connection with all needed apparatus.

FIG. 1 shows the distributive arrangement of temperature sensors and their a logical connection to a central evaluation unit. Each phase at each joint points are provided with a temperature sensor.

The loose joint detection algorithm proposed in this invention uses following assumptions:

Three phase system (phases marked L1, L2, L3);
The primary circuit is designed with the same copper cross sections in the three phases in each point; and
Balanced load (i.e. the currents in the three phases are approximately equal in each point of the primary circuit I1≈I2≈I3).

For the algorithm it is need to further divide the temperature measurements within one panel to groups of three temperature readings. The group always contain reading from L1, L2 and L3 from joints with the same position in the overall system:

Group 1—busbar joints L1, L2, L3;
Group 2—upper CB spouts L1, L2, L3;
Group 3—lower CB spouts L1, L2, L3; and
Group 4—cable connection joints L1, L2, L3, wherein group 4 is a further grouped area of temperature relevance.

Temperatures are measured on each joint in the group. The measurements do not have to be real time, sufficient reading period is once in one minute, however all three temperatures should be read in short interval of max. 5 seconds:

Joint L1—temperature T1;
Joint L2—temperature T2; and
Joint L3—temperature T3.

It is set a threshold of ΔT for giving alarm of loose joint (the threshold value depends on the temperature measurement accuracy and the unbalance expected in the system).

The loose joint detection algorithm is then as follows:
Set alarm loose joint in L1 if T1>(T2+ΔT) or T1>(T3+ΔT);
Set alarm loose joint in L2 if T2>(T1+ΔT) or T2>(T3+ΔT); and
Set alarm loose joint in L3 if T3>(T1+ΔT) or T3>(T2+ΔT).

Alternatively the algorithm might be as follows:
Set alarm loose joint in L1 if T1>(T2+ΔT) and T1>(T3+ΔT);
Set alarm loose joint in L2 if T2>(T1+ΔT) and T2>(T3+ΔT); and
Set alarm loose joint in L3 if T3>(T1+ΔT) and T3>(T2+ΔT).

The temperature values at the aforesaid joints are measured in the aforesaid groups. The groups 1 to 4 correspond with the central data collection and processing unit for one switchgear panel. In this unit is implemented the aforesaid algorithm, in order to observe the real temperatures versus temperature limits, and to generate alarm if the aforesaid conditions are fulfilled.

Figure 2:
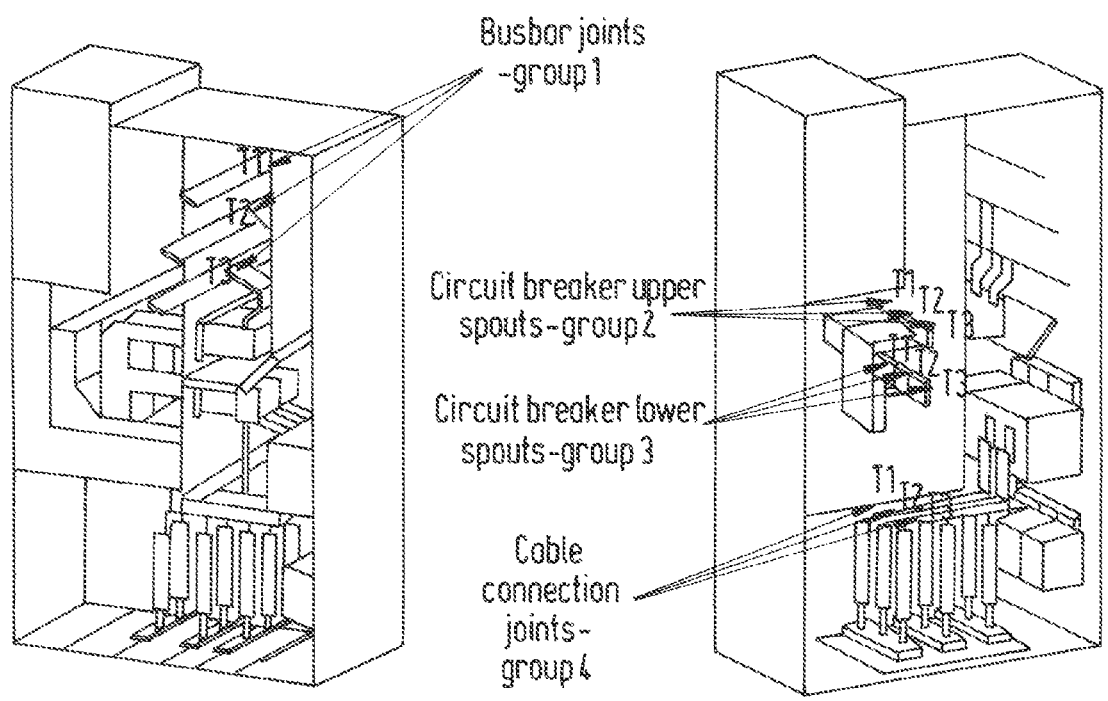
FIG. 2 a perspective view of a switchgear.

FIG. 2 shows one panel form different side views. The aforesaid temperature sensors are distributed in the three phase arrangement and considered as groups for each phase and each joint.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A method for loose joint detection in a three phase medium voltage switchgear including busbar joints, circuit breaker upper and lower spouts, and cable connection joints, arranged in an air insulated housing, and several temperature measurement points, the method comprising:
    measuring actual temperatures at a first phase as a first temperature (T1), at a second phase as a second temperature (T2), at a third phase as a third temperature (T3), and at one or more predefined critical points;
    comparing the temperatures in a logical dependency comprising Ti>(Tj+ΔT), with i≠j, permuted with i from 1, 2, 3 and j from 1, 2, 3, wherein ΔT is a threshold tolerance value; and
    setting an alarm if the above condition is fulfilled, the alarm being set, based on an indication condition, for:
        a loose joint in the first phase if T1>(T2+ΔT) or T1>(T3+ΔT); and/or
        a loose joint in the second phase if T2>(T1+ΔT) or T2>(T3+ΔT); and/or
        a loose joint in the third phase if T3>(T1+ΔT) or T3>(T2+ΔT).

2. The method of claim 1, wherein the critical points include a busbar joint, a circuit breaker upper spout, a circuit breaker lower spout, a cable connection, or a combination of two or more of any of these.

3. The method of claim 1, wherein the critical points include a busbar joint.

4. The method of claim 1, wherein the critical points include a circuit breaker upper spout.

5. The method of claim 1, wherein the critical points include a circuit breaker lower spout.

6. The method of claim 1, wherein the critical points include a cable connection.

7. The method of claim 1, wherein the indication condition includes the loose joint in the first phase if T1>(T2+ΔT).

8. The method of claim 1, wherein the indication condition includes the loose joint in the first phase if T1>(T3+ΔT).

9. The method of claim 1, wherein the indication condition includes the loose joint in the second phase if T2>(T1+ΔT).

10. The method of claim 1, wherein the indication condition includes the loose joint in the second phase if T2>(T3+ΔT).

11. The method of claim 1, wherein the indication condition includes the loose joint in the third phase if T3>(T1+ΔT).

12. The method of claim 1, wherein the indication condition includes the loose joint in the third phase if $T3>(T2+\Delta T)$.

13. The method of claim 1, further comprising:
predefining a value range for $\Delta T$;
storing the value range in a control device; and
reading all temperatures into the control device, the control device evaluating according to the logical dependency or if a loose joint in the first phase is indicated, wherein $T1>(T2+\Delta T)$ or $T1>(T3+\Delta T)$, and/or a loose joint in the second phase is indicated, wherein $T2>(T1+\Delta T)$ or $T2>(T3+\Delta T)$, and/or a loose joint in the third phase is indicated, wherein $T3>(T1+\Delta T)$ or $T3>(T2+\Delta T)$, thereby generating an alarm signal.

14. The method of claim 1, comprising:
storing all measured temperature values in a datafile, thereby enabling retrospective analysis of historical data.

15. The method of claim 14, further comprising:
automatically storing and organizing the datafile as a shift register including an adjustable time frame or time slot.

16. The method of claim 15, wherein the time slot is also event triggered.

17. The method of claim 16, wherein a retrospective time slot is also event triggered.

18. A medium voltage switchgear, comprising:
a loose joint detector at one or more busbar joints, circuit breaker upper sprouts, circuit breaker lower spouts, and/or cable connection joints, arranged in an air insulated housing, carrying out the method of claim 1;
temperature sensors arranged at joint points of the switchgear, at the busbar joints, at the circuit breaker upper spouts, at the circuit breaker lower spouts, at the cable connection joints, the temperature sensors being arranged at all three phases of the joint points and spouts each; and
a central evaluation unit feed receiving all temperature sensors values, in order to calculate the logical dependency.

* * * * *